(12) United States Patent
Huang et al.

(10) Patent No.: US 11,158,383 B2
(45) Date of Patent: Oct. 26, 2021

(54) OPERATION METHOD FOR 3D NAND FLASH AND 3D NAND FLASH

(71) Applicant: Yangtze Memory Technologies Co., Ltd., Wuhan (CN)

(72) Inventors: Kai Jin Huang, Wuhan (CN); Jin Lyu, Wuhan (CN); Gang Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/872,268

(22) Filed: May 11, 2020

(65) Prior Publication Data

US 2021/0295926 A1  Sep. 23, 2021

Related U.S. Application Data

(63) Continuation of application No. PCT/CN2020/080636, filed on Mar. 23, 2020.

(51) Int. Cl.
*G11C 16/04* (2006.01)
*G11C 16/24* (2006.01)
*G11C 16/10* (2006.01)

(52) U.S. Cl.
CPC .......... *G11C 16/24* (2013.01); *G11C 16/0483* (2013.01); *G11C 16/10* (2013.01)

(58) Field of Classification Search
CPC ................................................. G11C 16/0483
USPC ..................................................... 365/185.11
See application file for complete search history.

(56) References Cited

U.S. PATENT DOCUMENTS

| 2005/0059194 | A1 | 3/2005 | Lee |
| 2011/0305088 | A1 | 12/2011 | Huang |
| 2012/0175637 | A1 | 7/2012 | Miyata |
| 2014/0192594 | A1* | 7/2014 | Lue .................... G11C 16/0483 365/185.11 |
| 2015/0162088 | A1 | 6/2015 | Dusija |
| 2015/0294726 | A1 | 10/2015 | Sim |
| 2019/0108883 | A1 | 4/2019 | Yu |

FOREIGN PATENT DOCUMENTS

| CN | 1906700 A | 1/2007 |
| CN | 101727977 A | 6/2010 |
| CN | 104143358 A | 11/2014 |
| CN | 107393588 A | 11/2017 |
| CN | 108028070 A | 5/2018 |
| CN | 109308929 A | 2/2019 |
| CN | 110622249 A | 12/2019 |

\* cited by examiner

*Primary Examiner* — Jason Lappas
(74) *Attorney, Agent, or Firm* — Winston Hsu

(57) ABSTRACT

An operation method for a 3D NAND flash having a plurality of bit lines, wherein the plurality of bit lines comprises a plurality of layers, the operation method includes defining a plurality of upper layers of the plurality of bit lines of the 3D NAND flash as a plurality of upper select gates and a top layer of the plurality of bit lines of the 3D NAND flash as a top dummy layer; and applying a first voltage on a first top dummy layer of a select bit line of the plurality of bit lines to turn on the first top dummy layer of the select bit line of the plurality of bit lines when programming.

16 Claims, 2 Drawing Sheets

OPERATION METHOD FOR 3D NAND FLASH AND 3D NAND FLASH

CROSS REFERENCE TO RELATED APPLICATIONS

This is a continuation application of International Application No. PCT/CN2020/080636 filed on Mar. 23, 2020, which is incorporated herein by reference.

BACKGROUND OF THE INVENTION

1. Field of the Invention

The present invention relates to an operation method for 3D NAND flash and a 3D NAND flash, and more particularly, to an operation method for 3D NAND flash and a 3D NAND flash capable of improving characteristic of 3D NAND flash.

2. Description of the Prior Art

In order to implement programming for a specific string of a 3D NAND flash, controlling upper select gates and lower select gates are necessary to a conventional architecture of the 3D NAND flash, which defines a plurality of upper layers as a plurality of upper select gates, such that threshold voltages of the upper select gates may be respectively trimmed to a proper range, or a threshold voltage of the upper gates may be trimmed as a whole to a proper range. For a select string of the 3D NAND flash, a voltage Vtsg is applied on the upper select gates of the select string to turn on the upper select gates. As such, when the upper select gates of the select string are fully turned on, a programming efficiency of the select string is increased. In addition, 0V is applied on the upper select gates of unselect strings to turn off the upper select gates of the unselect strings. Thus, when the upper select gates of the unselect strings are fully turned off, a programming interference caused by leakage current of the unselect strings may be avoided.

However, a subthreshold of a top layer of the upper select gates is inferior to that of other upper select gates, which generates huge programming interference. In addition, a threshold voltage of the upper select gates is increased and a consistency thereof is decreased, such that the upper select gates cannot be fully turned on when a temperature goes down, and severe programming interference and coupling interference are generated between layers. Therefore, improvements are necessary to the prior art.

SUMMARY OF THE INVENTION

The present invention provides an operation method for 3D NAND flash and a 3D NAND flash to reduce programming interference and coupling interference.

An embodiment of the present invention discloses an operation method for a 3D NAND flash having a plurality of bit lines, wherein the plurality of bit lines comprises a plurality of layers, the operation method comprises defining a plurality of upper layers of the plurality of bit lines of the 3D NAND flash as a plurality of upper select gates and a top layer of the plurality of bit lines of the 3D NAND flash as a top dummy layer; and applying a first voltage on a first top dummy layer of a select bit line of the plurality of bit lines to turn on the first top dummy layer of the select bit line of the plurality of bit lines when programming.

Another embodiment of the present invention discloses a 3D NAND flash, having a plurality of bit lines, wherein the plurality of bit lines comprises a plurality of layers, and each of the plurality of bit lines comprises a top dummy layer, a top layer of each of the plurality of bit lines of the 3D NAND flash; a plurality of upper select gates; a plurality of upper dummy layers; a plurality of storage layers; a plurality of lower dummy layers; and a lower select gate; wherein a first voltage is applied on a first top dummy layer of a select bit line of the plurality of bit lines to turn on the first top dummy layer of the select bit line of the plurality of bit lines when programming.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
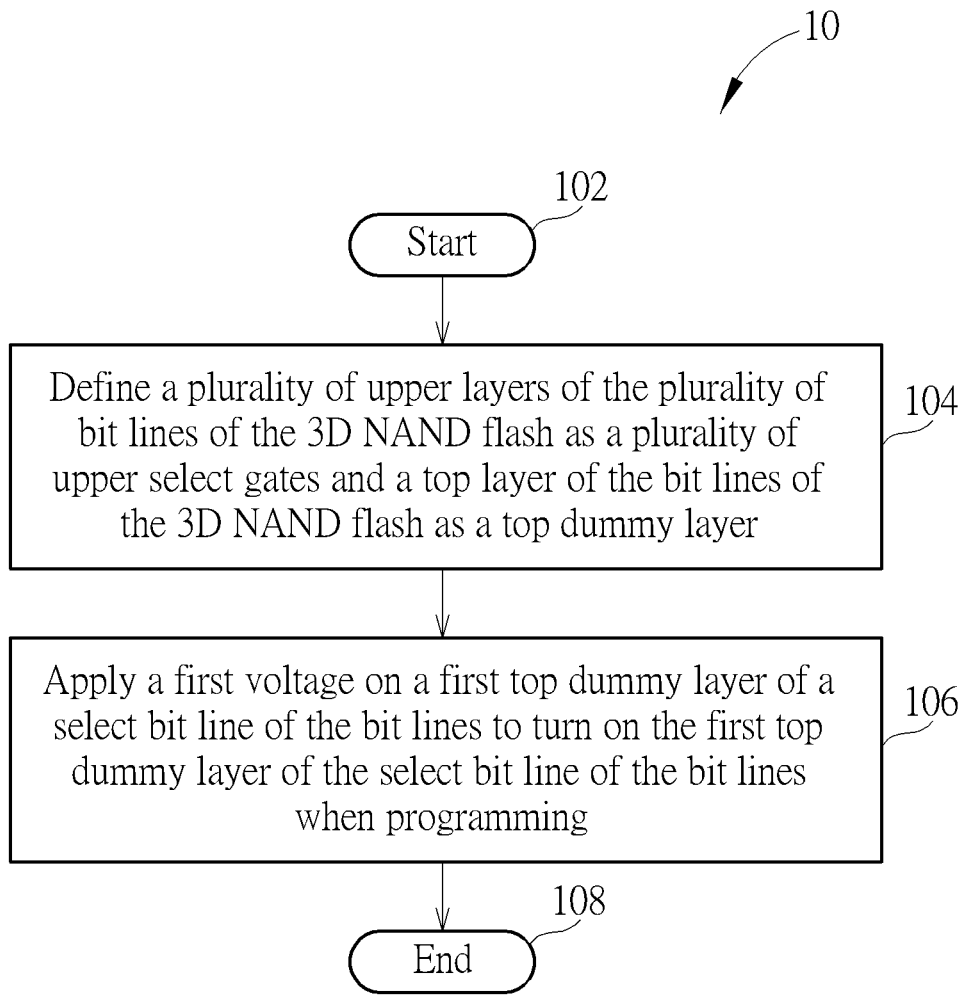
FIG. 1 is a schematic diagram of an operation process for a 3D NAND flash according to an embodiment of the present invention.

FIG. 1 is a schematic diagram of an operation process 10 for a 3D NAND flash according to an embodiment of the present invention. The 3D NAND flash may include a plurality of bit lines, wherein each of the bit lines includes a plurality of layers. The operation process 10 for the 3D NAND flash includes the following steps:

Step 102: Start.

Step 104: Define a plurality of upper layers of the plurality of bit lines of the 3D NAND flash as a plurality of upper select gates and a top layer of the bit lines of the 3D NAND flash as a top dummy layer.

Step 106: Apply a first voltage on a first top dummy layer of a select bit line of the bit lines to turn on the first top dummy layer of the select bit line of the bit lines when programming.

Step 108: End.

According to the operation process 10, in step 104, the upper layers of the bit lines of the 3D NAND flash are defined as the upper layers, except that the top layer of the bit lines of the 3D NAND flash is defined as the top dummy layer. In step 106, when programming, the first voltage Vtsg is applied on the first top dummy layer of the select bit line to turn on the first top dummy layer of the select bit line of the bit lines, such that the first top dummy layer of the select bit line is fully turned on and a second plurality of top dummy layers respectively corresponding to a plurality of unselect bit lines of the bit lines are cut off to turn off the upper select gates of the unselect bit lines. In an embodiment, the first top dummy layer is 6 to 8 volt to turn on the first top dummy layer of the select bit line. In other words, when the select bit line is under programming, the top dummy layers and the upper select gates of other unselect bit lines of the 3D NAND flash are turned off, so as to decrease leakage current of the upper select gates of the unselect bit lines and decrease a programming interference to the select bit lines.

Figure 2:
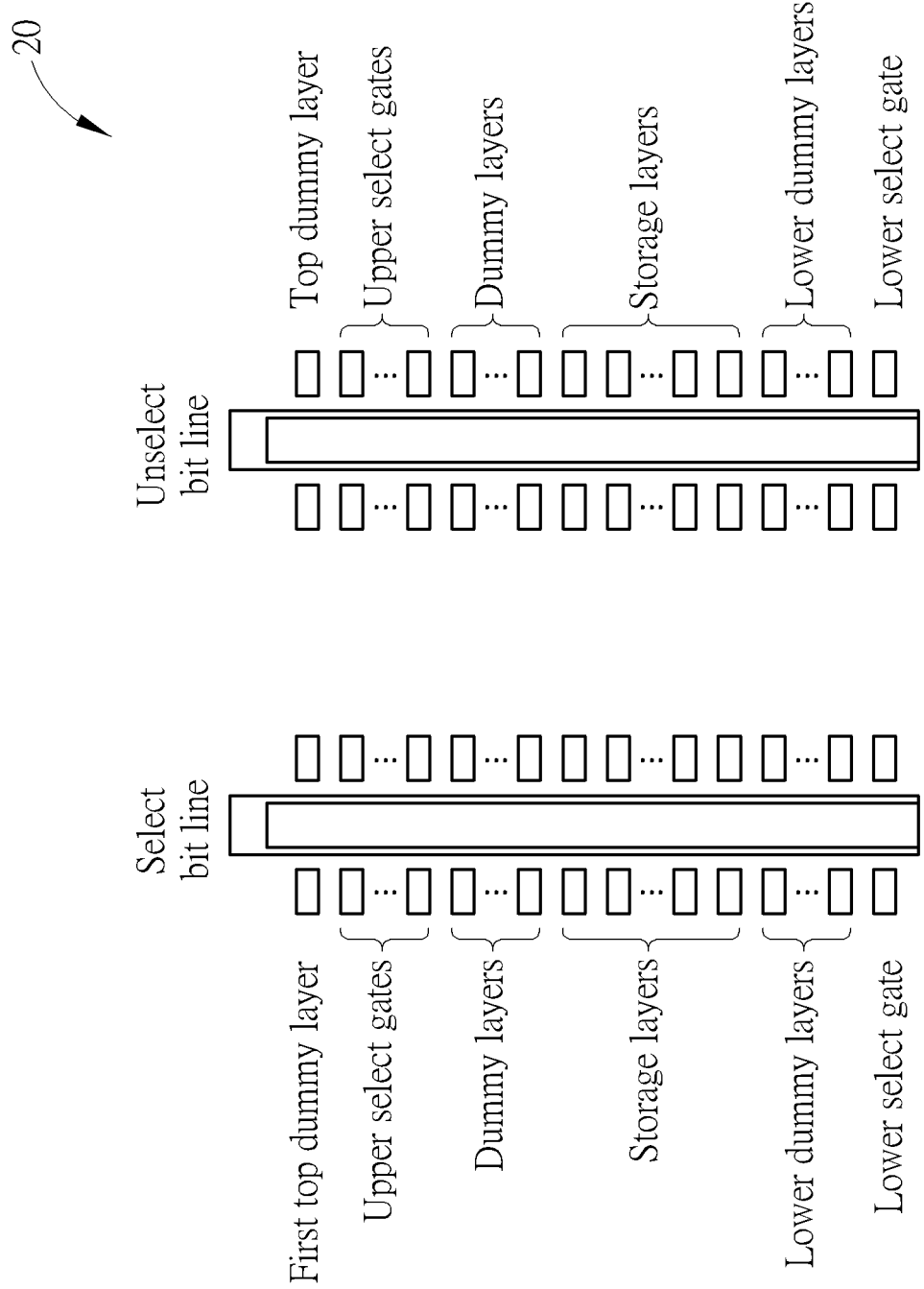
FIG. 2 is a schematic diagram of a 3D NAND flash according to an embodiment of the present invention.

Please refer to FIG. 2, which is a schematic diagram of a 3D NAND flash 20 according to an embodiment of the present invention. In this embodiment, the 3D NAND flash 20 includes a select bit line and an unselect bit line. The select bit line includes a first top dummy layer, a plurality of upper select gates, a plurality of upper dummy layers, a plurality of storage layers, a plurality of lower dummy layers and a lower select gate. The unselect bit line includes a top dummy layer, a plurality of upper select gates, a plurality of upper dummy layers, a plurality of storage layers, a plurality of lower dummy layers and a lower select gate. Notably, only one unselect bit line is shown in FIG. 2, and other amounts of unselect bit line belong to the scope of the present invention, which is not limited thereto.

In the example, a slope of subthreshold of the upper select gates of the select bit line is increased when the top layer of the bit line is defined as the first top dummy layer. More specifically, the slope of subthreshold of the upper select gates of the select bit line is increased when programming, a threshold voltage for cutting off the upper select gates of the select bit line is decreased, such that leakage current of the upper select gates of the unselect bit lines is mitigated and the programming interference from other unselect bit lines are decreased. In addition, a temperature characteristic of the upper select gates of the select bit line is improved with smaller threshold voltage and a distribution of the threshold voltage is more convergent. As such, the upper select gates of the select bit line may be fully turned on to speed up a programming process with fewer programming impulses and a programming voltage is reduced. Therefore, the programming interference and coupling interference between layers are reduced.

Moreover, when the slope of subthreshold of the upper select gates of the select bit line is increased, an increment of the threshold voltage is reduced when the temperature drops, and the upper select gates may be fully turned on with higher threshold voltage, which increases a threshold voltage window of the upper select gates of the select bit line.

Notably, the embodiments stated above illustrate the concept of the present invention, those skilled in the art may make proper modifications accordingly, and not limited thereto.

In summary, the operation method for a 3D NAND flash of the present invention improves characteristic of upper select gates of select bit line of the 3D NAND flash, which reduces a programming interference, a coupling interference and increases a threshold voltage window of the upper select gates.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operation method for a 3D NAND flash having a plurality of bit lines, wherein the plurality of bit lines comprises a plurality of layers, the operation method comprising:
    defining a plurality of upper layers of the plurality of bit lines of the 3D NAND flash as a plurality of upper select gates and a top layer of the plurality of bit lines of the 3D NAND flash as a top dummy layer; and
    applying a first voltage on a first top dummy layer of a select bit line of the plurality of bit lines to turn on the first top dummy layer of the select bit line of the plurality of bit lines when programming.

2. The operation method of claim 1, wherein the step of applying the first voltage on the first top dummy layer of the select bit line of the plurality of bit lines to turn on the first top dummy layer of the select bit line of the plurality of bit lines when programming comprises:
    cutting off a second plurality of top dummy layers respectively corresponding to a plurality of unselect bit lines of the plurality of bit lines to increase a slope of subthreshold of the plurality of upper select gates of the select bit line.

3. The operation method of claim 2, wherein when the slope of subthreshold of the plurality of upper select gates of the select bit line is increased, a threshold voltage for cutting off the plurality of upper select gates of the select bit line is decreased.

4. The operation method of claim 1, wherein when the slope of subthreshold of the plurality of upper select gates of the select bit line is increased, a threshold voltage window of the plurality of upper select gates of the select bit line is increased.

5. The operation method of claim 1, wherein the first top dummy layer of the select bit line of the plurality of bit lines is fully turned on to increase a programming speed and decrease a programming voltage and a coupling interference between the plurality of layers of the select bit line when programming.

6. The operation method of claim 1, wherein the first voltage of applied on the first dummy layer of the select bit line of the plurality of bit lines to turn on the on the first top dummy layer is 6 to 8 volt.

7. The operation method of claim 1, wherein when the first top dummy layer of the select bit line of the plurality of bit lines is fully turned on, leakage currents of the plurality of unselect bit lines are reduced when programming.

8. The operation method of claim 1, wherein when the first top dummy layer of the select bit line of the plurality of bit lines is fully turned on, a threshold voltage of the plurality of upper select gates of the select bit line is reduced and a distribution of the threshold voltage is convergent.

9. A 3D NAND flash, having a plurality of bit lines, wherein the plurality of bit lines comprises a plurality of layers, and each of the plurality of bit lines comprising:
    a top dummy layer, a top layer of each of the plurality of bit lines of the 3D NAND flash;
    a plurality of upper select gates;
    a plurality of upper dummy layers;
    a plurality of storage layers;
    a plurality of lower dummy layers; and
    a lower select gate;
    wherein a first voltage is applied on a first top dummy layer of a select bit line of the plurality of bit lines to turn on the first top dummy layer of the select bit line of the plurality of bit lines when programming.

10. The 3D NAND flash of claim 9, wherein a second plurality of top dummy layers respectively corresponding to a plurality of unselect bit lines of the plurality of bit lines are cut off to increase a slope of subthreshold of the plurality of upper select gates of the select bit line.

11. The 3D NAND flash of claim 10, wherein when the slope of subthreshold of the plurality of upper select gates of the select bit line is increased, a threshold voltage for cutting off the plurality of upper select gates of the select bit line is decreased.

12. The 3D NAND flash of claim 9, wherein when the slope of subthreshold of the plurality of upper select gates of the select bit line is increased, a threshold voltage window of the plurality of upper select gates of the select bit line is increased.

13. The 3D NAND flash of claim 9, wherein the first top dummy layer of the select bit line of the plurality of bit lines is fully turned on to increase a programming speed and decrease a programming voltage and a coupling interference between the plurality of layers of the select bit line when programming.

14. The 3D NAND flash of claim 9, wherein the first voltage of applied on the first dummy layer of the select bit line of the plurality of bit lines to turn on the on the first top dummy layer is 6 to 8 volt.

15. The 3D NAND flash of claim 9, wherein when the first top dummy layer of the select bit line of the plurality of bit lines is fully turned on, leakage currents of the plurality of unselect bit lines are reduced when programming.

16. The 3D NAND flash of claim 9, wherein when the first top dummy layer of the select bit line of the plurality of bit lines is fully turned on, a threshold voltage of the plurality of upper select gates of the select bit line is reduced and a distribution of the threshold voltage is convergent.

* * * * *